United States Patent [19]

Kaplan et al.

[11] 4,414,314
[45] Nov. 8, 1983

[54] RESOLUTION IN OPTICAL LITHOGRAPHY

[75] Inventors: Leon H. Kaplan, Yorktown; Richard D. Kaplan, Wappingers Falls; Steven M. Zimmerman, Pleasant Valley, all of N.Y.

[73] Assignee: International Business Machines Corporation, Armonk, N.Y.

[21] Appl. No.: 352,929

[22] Filed: Feb. 26, 1982

[51] Int. Cl.³ .............................................. G03C 5/00
[52] U.S. Cl. .................................. 430/311; 430/330; 430/321; 430/324
[58] Field of Search ............... 430/292, 294, 324, 330, 430/321, 311; 428/913; 8/444

[56] References Cited

U.S. PATENT DOCUMENTS

| | | | |
|---|---|---|---|
| 4,023,185 | 5/1977 | Bloom et al. | 346/135 |
| 4,328,298 | 5/1982 | Nester | 430/5 |
| 4,348,471 | 9/1982 | Shelnut et al. | 430/165 |

*Primary Examiner*—John E. Kittle
*Assistant Examiner*—José G. Dees
*Attorney, Agent, or Firm*—Mitchell S. Bigel

[57] ABSTRACT

Improved resolution in optical lithography, as used in the very large scale integration of electronic circuits, is obtained by employing a thin film of 4-phenylazo-1-naphthylamine between silicon substrate and overlying layer of light sensitive photoresist. The 4-phenylazo-1-naphthylamine acts as a stable, highly light absorbent medium exhibiting chemical and physical compatibility with the silicon substrate and photoresists with ether-type solvent systems.

10 Claims, 3 Drawing Figures

RESOLUTION IN OPTICAL LITHOGRAPHY

BACKGROUND OF THE INVENTION

1. Field of the Invention

The subject invention relates to optical lithography techniques and, more particularly, to optical lithography processes and structures which act to provide improved resolution in the manufacture of integrated circuits.

2. Description of the Problem and Prior Art

Optical lithography techniques typically involve the exposure of a photosensitive resist material in a pattern by light, and the subsequent formation of this pattern in the resist layer by etching. Although the fundamental limitation to spacial resolution in such a process resides in the diffraction of the radiation used which in turn depends upon the wavelength of the radiation, practical resolution is limited by the degree of scattering and reflection from the surface of the underlying substrate. The problem is compounded where a monochromatic exposure of the photoresist film over the reflecting substrate establishes a standing-wave pattern of light within the film. The standing-wave results in a significant attenuation of the intensity of the light along the thickness direction of the film, resulting in varying degrees of exposure of the photoresist. The condition becomes deleterious when using projection exposures for the production of patterns within the micron and submicron range, since excessive exposures are required to fully bring out the smaller patterns.

It is known that variation of exposure in thickness direction can be related to the square of the well-known standing-wave ratio (SWR), values for which range up to the order of 25 for bare or oxidized silicon substrates and higher for highly reflective substrates, such as aluminum films. The least favorable situation occurs for those reflective surfaces (i.e., aluminum, other metals, bare silicon, and oxidized silicon with specific oxidized thicknesses) that produce an optical node or minimum intensity at the photoresist-substrate interface, thereby requiring aggressive development or special procedures, such as post development ozone etching, to remove the photoresist residues within the micron sized images. Dimensional control of micron size images is therefore difficult to maintain, especially for densely packed image arrays.

One method of eliminating reflection from the substrate surface involves the formation of a sub-layer of highly absorbent material. Such layer acts to prevent the radiation from reaching the reflective substrate surface thereby eliminating the scattering and standing wave phenomena which act to degrade resolution. However, there are a number of requirements coupled with the use of an absorbent sub-layer. For example, the absorbing sub-layer must be compatible with the overlying resist film and underlying substrate as pertains to coating, adhesion and development. The sub-layer must also be chemically and structurally stable in the face of the overlying resist and processes for forming same, and yet thin enough so that it may readily be removed after development of the photoresist. The most logical approach is to form the sub-layer from resist material which has been loaded with a suitable dye. However, dyes typically tend to segregate out of polymer material upon drying unless their concentrations are so low as to give very small absorptions. Where dye concentrations are low, then, the thickness required must be so large as to make the removal of such layers impractical.

Another approach to reducing reflection from substrates involves the use of a double-layer photoresist film whereby only the top layer is photosensitive. In such an arrangement, a significant reduction of the SWR occurs within the top layer, and improved dimensional control occurs. Such an arrangement is described in IBM Technical Disclosure Bulletin entitled "Two and Three-Layer Photoresist Technique" by Kaplan et al, Vol. 15, No. 7, December 1972, pp. 2339-40. This article also describes the use of an interlayer between a thin-top layer and a thick-bottom layer on the substrate. The difficulty with the two and three-layer photoresist techniques described by Kaplan et al resides in the fact that they are hard to fabricate and cumbersome to use. This difficulty is, in part, due to the fact that there are interactions of the bottom layer of resist with both the solvent system of the top layer during application and with the developing solution of the top layer during development.

A further multilayer resist structure is described by W. J. Stetson in an IBM Technical Disclosure Bulletin entitled "Producing Reduced Reflectivity Master Mask on Working Plate", Vol. 18, No. 10, March 1976, pp. 3167. As is evident, the Stetson approach involves the deposition of several layers of material using reactive sputtering.

Antihalation layers which absorb light transmitted by light sensitive layers in order to prevent reflection to the sensitive layer are known in the lithographic printing art. Typical of the antihalation approaches are those described by Nadeau et al in U.S. Pat. No. 2,596,713 and Klockgether et al in U.S. Pat. No. 3,262,782. It is clear from a review of these patents that the materials involved in this art are not analogous to those involved in the fabrication of integrated circuits in micron and sub-submicron semiconductor technology. More particularly, the antihalation techniques involve the use of photographic films and plates wherein the resultant resolution in development is orders of magnitude lower than that required in the manufacture of circuits using VLSI (very large scale integration).

In accordance with the present invention, improved resolution in optical lithography, as used in VLSI, is obtained by eliminating light scattering and reflection from a silicon substrate surface into the overlying photosensitive layer by employing a chemically and structurally stable sub-layer of highly absorbent material between the photosensitive layer and substrate. More particularly, in accordance with the present invention, improved resolution in optical lithography for VLSI is obtained by employing a thin film of 4-phenylazo-1-naphthylamine as the light absorbent sub-layer. Such sub-layer is formed by the evaporation of Sudan Black B dyestuff at $10^{-3}$ to $10^{-4}$ Torr and approximately 120° C. for approximately 5 minutes. Evaporation for 5 minutes and post-baking for 10 minutes at 160° C. results in a thin, stable and adherent film capable of efficiently absorbing light across the entire UV spectrum, and at the same time exhibiting compatibility with the resist and substrate.

It is, therefore, an object of the present invention to provide improved resolution in optical lithography, as employed in the manufacture of integrated circuits.

It is a further object of the present invention to provide improved resolution in optical lithography such as to permit the fabrication of micron and submicron patterns on semiconductor substrates.

It is yet a further object of the present invention to provide improved resolution in optical lithography by employing an intermediate layer between the silicon substrate and photosensitive resist layer so as to eliminate substrate light reflection and therefore light scattering and standing wave patterns in the optical exposure of the photosensitive material used to form patterns on the substrate.

It is yet still a further object of the present invention to provide improved optical lithography processes and structures for the fabrication of integrated circuits by forming a light absorbing layer of 4-phenylazo-1-naphthylamine between photosensitive resist layer and semiconductor substrate for purposes of reducing reflection from the substrate when exposing the photosensitive resist material to light.

The foregoing and other objects, features and advantages of the invention will be apparent from the following more particular description of the preferred embodiment of the invention, as illustrated in the accompanying drawings.

DETAILED DESCRIPTION OF THE DRAWINGS

Figure 1:
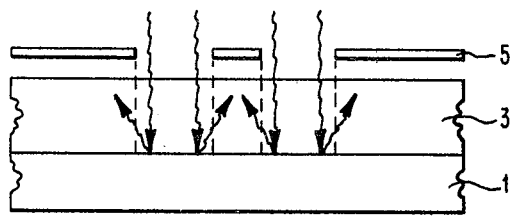
FIG. 1 shows a typical prior art arrangement employed in the manufacture of integrated circuits wherein a photosensitive resist is positioned directly upon a semiconductor substrate.

With reference to FIG. 1, there is shown a conventional prior art arrangement wherein a semiconductor substrate is coated with a photosensitive resist material whereby openings and patterns may be formed in the resist material to allow treatment of the underlying substrate for purposes of forming microelectronic devices. Typically, substrate material 1 is silicon and photoresist material 3 is any of a variety of commercially available photosensitive resists. Mask 5 acts to block the incident light except where there are openings, as shown. The light source may be any of a variety of light sources. However, typically the light source is in the UV range. In this regard, a monochromatic light source is sometimes used.

As hereinabove described, one of the difficulties encountered in exposing the substrate with photoresist resides in light reflection and scattering from the substrate surface. As shown by the arrows in FIG. 1, such reflection and scattering from the substrate surface acts to degrade image quality and resolution.

Figure 2:
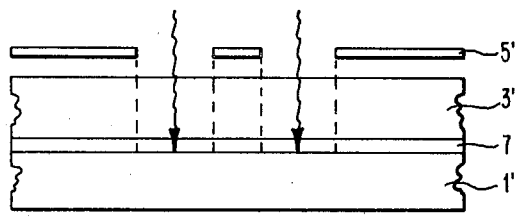
FIG. 2 shows a semiconductor substrate arrangement with a light absorbing layer of 4-phenylazo-1-naphthylamine, as provided in accordance with the present invention.

In accordance with the present invention and as shown in FIG. 2, light reflection and scattering is avoided by forming a particular, highly light-absorbent film 7 upon silicon substrate 1' prior to the formation of light sensitive photoresist layer 3'. The particular light-absorbent film 7 comprises a thin, evaporated coating of 4-phenylazo-1-naphthylamine having the formula

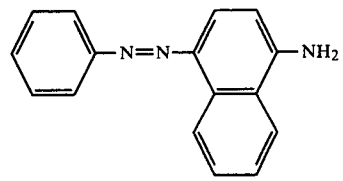

Such material is formed as a tough, highly absorbent film when the dyestuff known as Sudan Black B is vacuum evaporated. Sudan Black B is a well known dyestuff of the formula

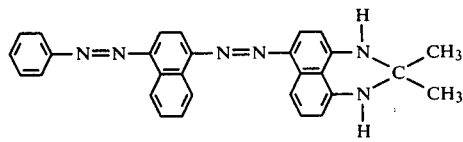

One process for the evaporation of such material is described in U.S. Pat. No. 4,023,185 to Bloom et al.

The process, in accordance with the present invention, for the formation of such a light-absorbent film on a silicon semiconductor substrate begins with loading the substrate into the chamber of a conventional vacuum evaporator. The evaporator chamber is then evacuated to a pressure between $10^{-3}$ and $10^{-4}$ Torr. The evaporation source, i.e. the Sudan Black B dyestuff, must be cleaned from the evaporation chamber and replaced after each run. After evacuating the chamber, the source is heated quickly to 120° C. and deposition is carried out for 5 minutes. After removal from the system, the substrate is post-baked for 10 minutes at 160° C. This operation results in the formation of a dye film on the silicon substrate of a thickness approximately 50 nm. The dye film is then coated with a conventional positive photosensitive resist 3', as will be described further hereinafter.

Figure 3:
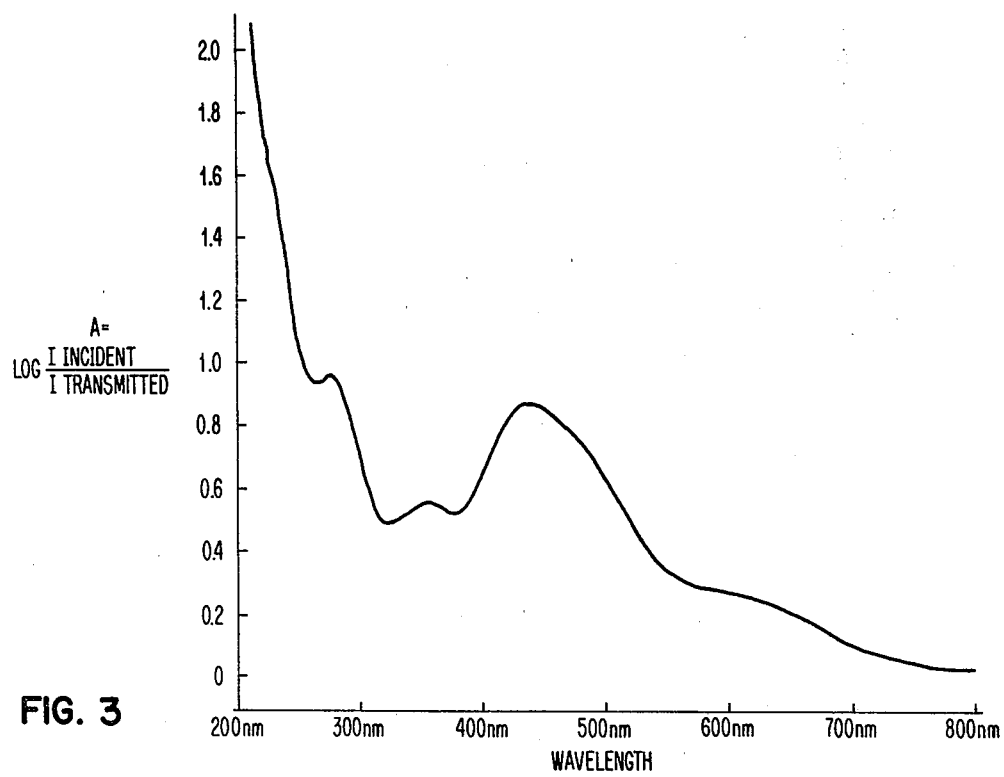
FIG. 3 shows the absorption curve for the absorbing layer of FIG. 2, fabricated in accordance with the present invention.

The film formed by the above-described process yields an absorption curve, as shown in FIG. 3. It can be seen that, despite the extreme thinness of the dye film, it is capable of efficiently absorbing light in the 250 to 440 nm wavelength range, i.e. mid and near UV. With such an absorption characteristic, little radiation is reflected from the silicon substrate surface in the range within which the photosensitive resist is active.

It has been found that by the above process, a smooth and continuous film of 4-phenylazo-1-naphthylamine is formed on the silicon substrate. The formation of such films from the evaporation of Sudan Black B dyestuff results in a structure which is chemically and physically compatible with the underlying silicon substrate. In addition, the resultant film structure is stable with time, and exhibits chemical and physical properties compatible with positive photosensitive resists having ether-type solvent systems, such as diglyme, ethyl cellosolve acetate or methyl cellosolve acetate. It has been found that such solvents do not interact with the dye.

In this regard, the post-bake operation is necessary to fix the dye film and prevent the photosensitive resist solvent system from dissolving out the dye from the dye film during the formation of the resist layer. Typically, resist layers are formed by spinning a relatively thick coating of liquid resist to a thin film of solid resist whereby most of the resist and substantially all of the resist solvent is removed. Where no post-bake occurs, dye migrates from the film and is removed with the bulk of the resist.

The post-bake operation, as hereinabove described, involves baking at 160° C. for 10 minutes. It has been found that at lower bake temperatures, i.e. 120° C. and lower, agglomeration of the dye occurs before the resist is applied. Accordingly, the post-bake operation should be carried out at temperatures above 120° C. for a period of 10 minutes or longer.

The dye film formed as an intermediate layer between the positive photosensitive resist and silicon substrate does not degrade the adhesion of the resist to the substrate. Typically, intermediate layers so formed tend to degrade adhesion unless they are selected and formed for the express purpose of promoting adhesion. Thus, it is apparent that there is little interaction between the dye layer and substrate to cause interface structure failure, i.e. to affect the bond between the silicon substrate and dye film. Likewise, there is little interaction between the dye layer and positive resist to cause interface structure failure, i.e. to affect the bond between the dye film and resist.

Examples of positive resist which may be employed with the dye film formed in accordance with the present invention are sensitized novolak resins, such as are described, for example, in U.S. Pat. Nos. 3,666,473 and 3,201,239. Such novolak resins are phenolformaldehyde resins which can be prepared by the acid catalyzed condensation of formaldehyde with an excess of a phenol. They are prepolymerized phenolformaldehyde resins prepared by the reaction of formaldehyde with a phenol having the formula

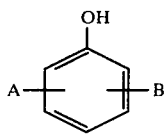

where (A) and (B) are selected from the group consisting of hydrogen and an alkyl group containing from one to six carbon atoms.

Suitable sensitizers for the above resists are diazo ketones, for example, those having the formula

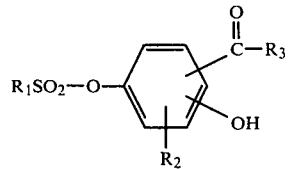

in which $R_1$ is a naphthoquinone-(1,2)-diazide radical, $R_2$ is selected from the group consisting of hydrogen and hydroxyl, and $R_3$ is selected from the group consisting of hydrogen, alkyl, acyl, alkoxy, acyloxy, amino, and heterocyclic groups.

The portions to be maintained between the diazo ketone sensitizer and the novolak resin may be between about 1:1 and 1:6 by weight and preferably about 1:2 and 1:4 by weight of sensitizer to resin.

Such resists exhibit a compatibility with the dye layer such that the dye remains fixed in the dye layer upon application of the resist layer. In addition, the dye layer does not degrade the adhesion bond between such resists and the silicon substrate.

While the invention has been particularly shown and described with reference to the preferred embodiment thereof, it will be understood by those skilled in the art that various changes in form and details may be made therein without departing from the spirit and scope of the invention.

What is claimed is:

1. An optical lithography process for creating a patterned photoresist on a silicon semiconductor substrate, comprising the steps of;
   providing a silicon semiconductor substrate;
   evaporating Sudan Black B dyestuff upon said silicon substrate to form a thin film of 4-phenylazo-1-naphthylamine;
   depositing positive resists having ether-type solvents on said 4-phenylazo-1-naphthylamine thin film; and
   exposing selected regions of said positive resist to light in the 250 to 440 nm wavelength range, the light passing through the selected regions of said positive resist and being absorbed by said 4-phenylazo-1-naphthylamine thin film thereunder, whereby said 4-phenylazo-1-naphthylamine thin film prevents reflection and scattering from the surface of said silicon substrate.

2. The process as set forth in claim 1 wherein said step of evaporating Sudan Black B dyestuff involves evaporating at a temperature of at least 120° C.

3. The process as set forth in claim 2 wherein said step of evaporating Sudan Black B dyestuff involves evaporating at a temperature of at least 120° C. for approximately 5 minutes.

4. The process as set forth in claim 3 wherein said substrate is baked at a temperature of at least 160° C. after said 4-phenylazo-1-naphthylamine thin film is evaporated.

5. The process as set forth in claim 3 wherein said substrate is baked at a temperature of at least 160° C. for approximately 10 minutes after said 4-phenylazo-1-naphthylamine thin film is evaporated.

6. The process as set forth in claim 3 wherein said positive resists include any one of diglyme, ethyl cellosolve acetate and methyl cellosolve acetate.

7. The process as set forth in claim 6 wherein said step of evaporating Sudan Black B dyestuff involves evaporating at a pressure between $10^{-3}$ and $10^{-4}$ Torr.

8. The process as set forth in claim 4 wherein said positive resists include sensitized novolak resins.

9. The process as set forth in claim 6 wherein said substrate is baked at a temperature of at least 160° C. after said 4-phenylazo-1-naphthylamine thin film is evaporated.

10. The process as set forth in claim 8 wherein said step of evaporating Sudan Black B dyestuff involves evaporating at a pressure between $10^{-3}$ and $10^{-4}$ Torr.

* * * * *